(12) United States Patent
Hsieh

(10) Patent No.: US 6,228,709 B1
(45) Date of Patent: *May 8, 2001

(54) METHOD OF FABRICATING HEMISPHERICAL GRAIN ELECTRODE

(75) Inventor: Wen-Yi Hsieh, Hsinchu (TW)

(73) Assignee: United Microelectronics Corp. (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/010,684

(22) Filed: Jan. 22, 1998

(30) Foreign Application Priority Data

Nov. 27, 1997 (TW) ................................. 86117835

(51) Int. Cl.⁷ .................................................. H01L 21/8242
(52) U.S. Cl. ............................................. 438/255; 438/398
(58) Field of Search ........................... 438/239, 253, 438/255, 396, 398, 254, 397

(56) References Cited

U.S. PATENT DOCUMENTS

| | | | |
|---|---|---|---|
| 5,405,801 | * 4/1995 | Han et al. | 438/398 |
| 5,464,791 | * 11/1995 | Hirota | 438/253 |
| 5,622,889 | * 4/1997 | Yoo et al. | 438/398 |
| 5,679,596 | * 10/1997 | Lu | 438/398 |
| 5,696,014 | * 12/1997 | Figura | 438/396 |
| 5,721,153 | * 2/1998 | Kim et al. | 438/398 |
| 5,723,373 | * 3/1998 | Chang et al. | 438/253 |
| 5,726,085 | * 3/1998 | Crenshaw et al. | 438/255 |
| 5,753,559 | * 5/1998 | Yew et al. | 438/398 |
| 5,759,262 | * 6/1998 | Weimer et al. | 438/398 |
| 5,821,152 | * 10/1998 | Han et al. | 438/398 |
| 5,837,581 | * 11/1998 | Cheng | 438/255 |
| 5,846,870 | * 12/1998 | Ishida et al. | 438/255 |
| 5,866,455 | * 2/1999 | Wu | 438/255 |
| 5,874,336 | * 2/1999 | Cherng | 438/255 |

* cited by examiner

Primary Examiner—Charles Bowers
Assistant Examiner—Jack Chen
(74) Attorney, Agent, or Firm—Rabin & Champagne, PC

(57) ABSTRACT

A method of fabricating an HSG electrode. An electrode is defined before the formation of an HSG layer. The HSG layer is then formed on the top surface and the side wall of the electrode. The HSG layer is thermal oxidized in a furnace by rapid thermal process, and a silicon oxide layer is formed on the surface of the HSG layer. Dipping the electrode into a dilute solution of hydrogen fluoride or buffered oxide etching (BOE), the silicon oxide layer is lifted off while an HSG structure is remained on the top surface and the side wall of the electrode.

11 Claims, 3 Drawing Sheets

METHOD OF FABRICATING HEMISPHERICAL GRAIN ELECTRODE

CROSS-REFERENCE TO RELATED APPLICATION

This application claims priority benefit of Taiwan application Serial no. 86117835, filed Nov. 27, 1997, the full disclosure of which is incorporated herein by reference.

BACKGROUND OF THE INVENTION

1. Field of the Invention

The invention relates to a method for fabricating a hemispherical grain (HSG) electrode, and more particular to a method of increasing the surface area of a storing node by forming a blanket HSG silicon (HSG-Si) layer on the bottom electrode, to obtain a higher capacitance of a capacitor in a dynamic random access memory (DRAM).

2. Description of the Related Art

In a DRAM, the typical method to access data is by charging or discharging optionally into each capacitor of the capacitor array on the semiconductor substrate.

Due to the higher and higher integration of IC, dimensions of devices or structures (such as transistors, capacitors) become smaller and smaller. Thus, the storage of charges (that is, the capacitance) of the capacitor in the design of a conventional planar capacitor decreases. The decrease of charge storage causes various problems, including mechanical deterioration and charge leakage by the larger susceptibility, and therefore, causes potential loss. The charge leakage caused by larger susceptibility may cause more frequent refresh period, and by which, memory can not handle data saving and reading properly. Moreover, the decrease of charge storage may need more complex data reading plan, or more sensitive charge induction amplifier.

Up to now, there are three ways to solve the problem of low capacitance of a capacitor resulted from the higher integration in a very large scaled integrated circuit. The first method is to reduce the thickness of the dielectric layer between two conductors of the capacitor. It is known that the capacitance is proportional to the inverse of distance between two conductors in a capacitor. Thus, the decrease of the thickness of dielectric layer increases the capacitance effectively. However, according to the consideration of the uniformity and stability of the dielectric layer, this is a method difficult to control. The second method, which is the most direct method, is to adapt the material with high dielectric constant, such as, tantalum oxide ($Ta_2O_5$), as the dielectric layer. However, the high leakage current and low breakdown voltage caused by the atomic arrangement of tantalum oxide still needs to be improved. The third method is to increase the surface area of the storage node of the capacitor. The capacitance is proportional to the surface area of storage node, that is, the conductor (electrode). Therefore, to increase the surface area of the storage node increases the capacitance as well. The very common structure for increasing the surface area is the fin-shape or the box-shape structure. These kinds of structures are complex for fabrication, and thus, cause the difficulty in mass production. Another structure with a larger surface area is the HSG structure.

FIG. 1a and FIG. 1b show a conventional process of fabricating an HSG-Si bottom electrode. Referring to FIG. 1a, on an oxide layer 100, a doped poly-silicon layer 102 is formed. A blanket HSG-Si layer 104 is formed on the doped poly-silicon layer 102. Using photolithography and etching process, the blanket HSG-Si layer 104 is patterned to form a bottom electrode 104a. As shown on FIG. 1b, in the conventional process, the HSG structure is formed on the top surface of the electrode only. The side wall of the electrode is flat, and thus, the surface gain of capacitance obtained by the formation of the HSG structure is limited.

SUMMARY OF THE INVENTION

It is therefore an object of the invention to provide a method for fabricating an HSG capacitor. By forming an HSG layer covering both the top surface and the side wall of an electrode, the surface gain of capacitance of the capacitor is effectively enhanced. The enhanced surface gain of capacitance further enhances the device quality.

To achieve these objects and advantages, and in accordance with the purpose of the invention, as embodied and broadly described herein, the invention is directed towards a method of fabricating an HSG electrode. A substrate having an oxide layer and a poly-silicon layer formed on the oxide layer is provided. The poly-silicon layer is patterned to form an electrode, which has a top surface and a side wall. An HSG-Si layer is formed on the top surface and the side wall of the electrode, and the oxide layer. By performing an oxidation process, the surface of the HSG-Si layer is transforming into a silicon oxide layer. The silicon oxide layer is removed.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of the specification, illustrate an embodiment of the invention and together with the description, serve to explain the principles of the invention. In the drawings.

DESCRIPTION OF THE PREFERRED EMBODIMENTS

In the invention, an electrode is defined before the formation of an HSG layer. The HSG layer is then formed on the top surface and the side wall of the electrode. The HSG layer is oxidized in a furnace, or a by rapid thermal process, and a silicon oxide layer is formed on the surface of the HSG layer. Dipping the electrode into a dilute solution of hydrogen fluoride or buffered oxide etching (BOE), the silicon oxide layer is lifted off while an HSG structure is remained on the top surface and the side wall of the electrode. Thus, the surface gain of capacitance is effectively enhanced. A detailed description is given as follows.

Figure 1A:
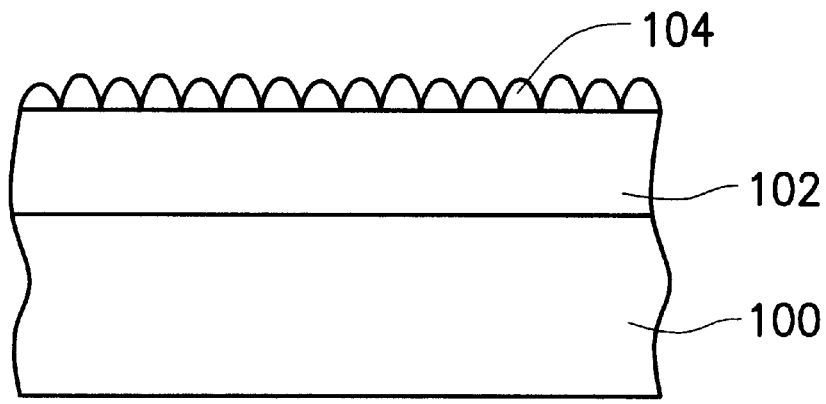
FIG. 1a and FIG. 1b show a conventional process of fabricating an HSG electrode; and FIG. 2a to FIG. 2e shows a process of fabricating an HSG electrode in a preferred embodiment according to the invention.
Figure 1B:
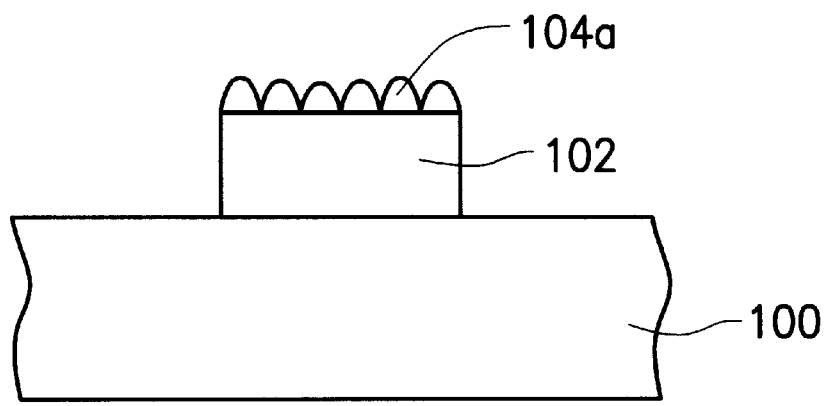
Figure 2A:
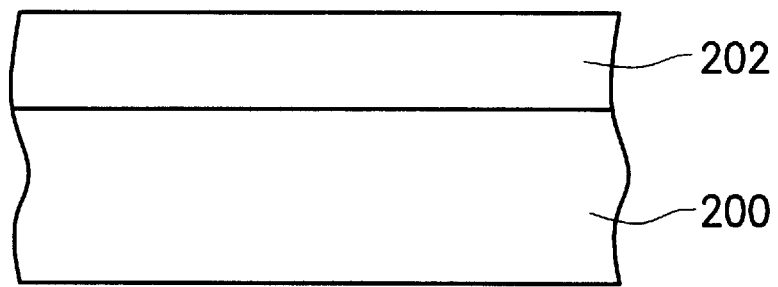

Referring to FIG. 2a, a substrate having a oxide layer 200 and a poly-silicon layer 202 formed on the oxide layer 200 is provided.

Figure 2B:
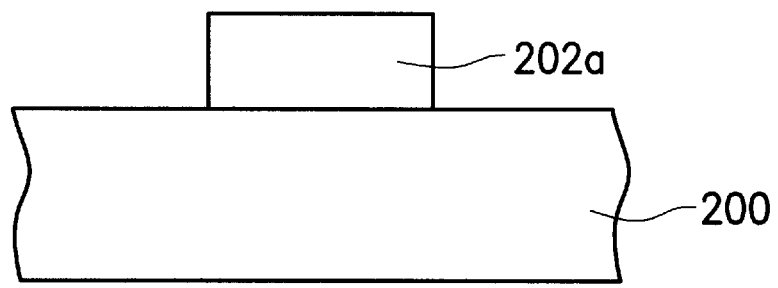

Referring to FIG. 2b, the poly-silicon layer 202 is patterned to form an electrode 202a. Hence, the electrode 202a has a top surface and a side wall exposed to air.

Figure 2C:
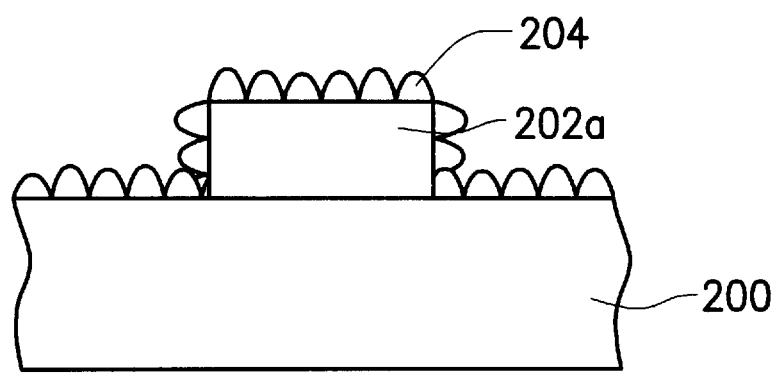

Referring to FIG. 2c, using chemical vapour deposition (CVD), a blanket HSG-Si layer 204 is formed over the substrate, that is, on the top surface and the side wall of the electrode 202a, and on the oxide layer 200. Since the blanket HSG-Si layer 204 formed on the oxide layer 200 is unwanted, a removing process is required.

Figure 2D:
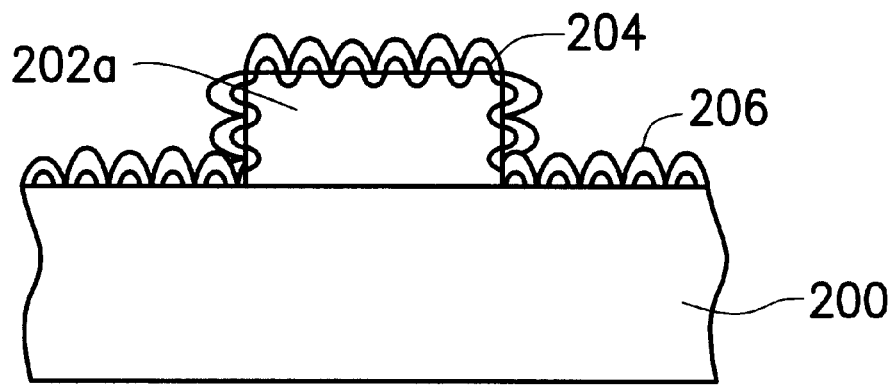

Referring to FIG. 2d, putting the substrate into a furnace for thermal oxidation, or performing a rapid thermal annealing process to the substrate, the surface of the HSG-Si layer is oxidised and transformed into a silicon oxide layer 206.

Figure 2E:
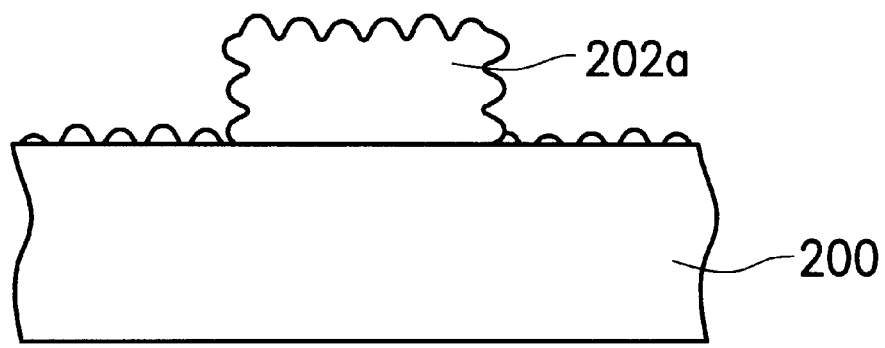

Referring to FIG. 2e, dipping the substrate into an etchant, such as a dilute solution of hydrogen fluoride or buffered oxide etching, the silicon oxide layer 206 is lifted off, while the HSG-Si layer on the top surface and the side wall of the electrode 202a is remained.

In the invention, an HSG-Si layer is formed not only on the top surface of the electrode, but also on the side wall of the electrode. Therefore, the surface area of the electrode is increased, and the surface gain of capacitance is effectively enhanced. The enhanced surface gain further enhances the device quality.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating an HSG electrode, comprising:
providing a substrate having an oxide layer and a poly-silicon layer formed on the oxide layer;
patterning the poly-silicon layer to form an electrode having a top surface and a side wall exposed to air;
forming an HSG-Si layer directly on the top surface and directly on the side wall of the electrode, and simultaneously forming the HSG-Si layer directly on the oxide layer;
performing an oxidation process to transform a surface of the HSG-Si layer into a silicon oxide layer using a rapid thermal annealing process; and
removing all of the silicon oxide layer, the HSG-Si layer remaining on the top surface and on the side wall of the electrode after all of the silicon oxide layer has been removed.

2. The method according to claim 1, wherein the electrode is a bottom electrode.

3. The method according to claim 1, wherein the HSG-Si layer is formed by chemical vapour deposition.

4. The method according to claim 1, wherein the silicon oxide layer is removed by dipping the substrate into a dilute solution of hydrogen fluoride.

5. The method according to claim 1, wherein the silicon oxide layer is removed by dipping the substrate into a dilute solution of buffered oxide etching.

6. The method according to claim 1, wherein the oxide layer comprises a single layer of oxide.

7. The method according to claim 6, wherein the single layer of oxide is formed in direct contact with the substrate, and the poly-silicon layer is formed in direct contact with the single layer of oxide.

8. A method of fabricating an HSG electrode, comprising:
providing a substrate having an oxide layer and a poly-silicon layer formed on the oxide layer;
patterning the poly-silicon layer to form an electrode having a top surface and a side wall exposed to air;
forming an HSG-Si layer directly on the top surface and the side wall of the electrode, and directly on the oxide layer;
performing an oxidation process to transform a surface of the HSG-Si layer into a silicon oxide layer; and
removing all of the silicon oxide layer in one operation, wherein the HSG-Si layer remains on the top surface and the side wall of the electrode after all of the silicon oxide layer is removed in the one operation.

9. The method according to claim 8, wherein the one operation includes dipping the substrate into a dilute solution of hydrogen fluoride or buffered oxide etching.

10. The method according to claim 9, wherein the oxide layer comprises a single layer of oxide.

11. The method according to claim 10, wherein the single layer of oxide is formed in direct contact with the substrate, and the poly-silicon layer is formed in direct contact with the single layer of oxide.

* * * * *